United States Patent [19]

Vavrek et al.

[11] Patent Number: 5,066,914
[45] Date of Patent: Nov. 19, 1991

[54] GRADIENT AMPLIFIER SYSTEM WITH FLEXIBLE AMPLIFIER ALLOCATION

[75] Inventors: Robert M. Vavrek, Waukesha; Thomas G. McFarland, Hartland, both of Wis.

[73] Assignee: General Electric Company, Milwaukee, Wis.

[21] Appl. No.: 498,731

[22] Filed: Mar. 26, 1990

[51] Int. Cl.⁵ .......................................... G01R 33/20
[52] U.S. Cl. .................................. 324/309; 324/322
[58] Field of Search ............ 330/30 R; 324/300, 307, 324/309, 310, 311, 312, 313, 314, 318, 322

[56] References Cited

U.S. PATENT DOCUMENTS

| | | |
|---|---|---|
| 3,808,545 | 4/1974 | Stanley . |
| 4,322,684 | 3/1982 | Hounsfield .......................... 324/309 |
| 4,613,949 | 9/1986 | Glover et al. ........................ 324/307 |
| 4,680,545 | 7/1987 | Gray et al. . |
| 4,680,547 | 7/1987 | Leue et al. . |
| 4,710,716 | 12/1987 | Keren et al. ......................... 324/309 |
| 4,901,020 | 2/1990 | Ladebeck ............................ 324/309 |
| 4,902,973 | 2/1990 | Keren .................................. 324/312 |
| 4,933,639 | 6/1990 | Barker ................................. 324/309 |

Primary Examiner—Michael J. Tokar
Attorney, Agent, or Firm—Quarles & Brady

[57] ABSTRACT

A magnetic resonance imaging system uses a pool of amplifiers to generate gradient signals. Each amplifier within the pool may be switched among any of the gradient axes, so as to efficiently allocate amplifier power among the gradients. In one embodiment, the amplifiers of the pools are connected in stacks by an input and output matrix comprised of mechanical switches driven in tandem by interlocked motors. The switches connect the outputs of the amplifiers in series. The input signal is "boot strapped" through the amplifier stack to provide proper signal level.

5 Claims, 5 Drawing Sheets

GRADIENT AMPLIFIER SYSTEM WITH FLEXIBLE AMPLIFIER ALLOCATION

BACKGROUND OF THE INVENTION

This invention relates to magnetic resonance imaging apparatus and more specifically to gradient amplifier systems for use in such apparatus.

Magnetic resonance imaging ("MRI") has developed as an important tool in diagnostic medicine. In MRI, as is understood by those skilled in the art, a body being imaged is held within a uniform magnetic field oriented along a z axis of a Cartesian coordinate system.

The spins of the nuclei of the body are excited into precession about the z axis by means of a radio frequency (RF) pulse and the decaying precession of the spins produces an NMR signal. The amplitude of the NMR signal is dependant, among other factors, on the number of precessing nuclei per volume within the imaged body termed the "spin density".

Magnetic gradient fields $G_x$, $G_y$, and $G_z$ are applied along the x, y and z axes, by means of gradient coils driven by a gradient amplifier system, so as to impress position information onto the NMR signals through phase and frequency encoding. A set of NMR signals may then be "reconstructed" to produce an image. Each set of NMR signals is comprised of many "views", a view being defined as one or more NMR signal acquisitions made under the same x and y gradients fields.

Figure 1:
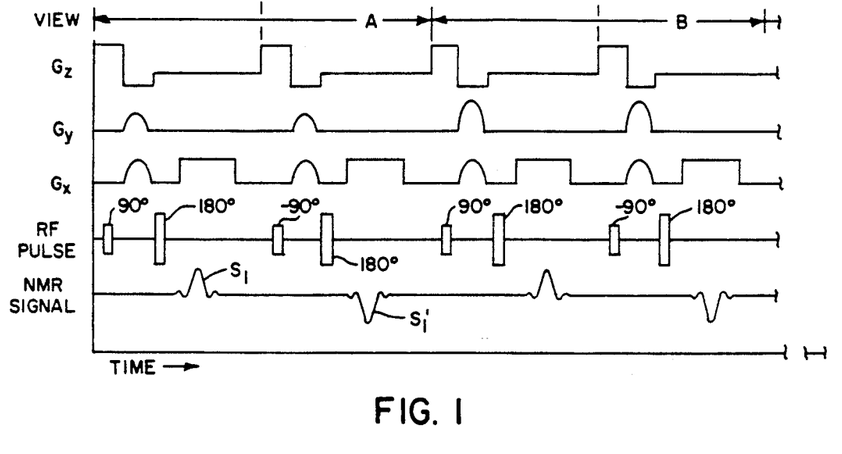
FIG. 1 is a graphical representation of an MRI pulse sequence showing gradient waveforms $G_x$, $G_y$, and $G_z$.

Referring to FIG. 1, a typical "spin echo" pulse sequence for acquiring data under the spin warp MRI technique includes: 1) a z-axis gradient $G_z$ activated during a first 90° RF pulse to select the image slice in the z axis, 2) a y-axis gradient field $G_y$ to phase encode the precessing nuclear spins in the y direction, and 3) an x-axis gradient $G_x$ activated during the acquisition of the NMR signal to frequency encode the precessing nuclear spins in the x direction. Two such NMR acquisitions, $S_1$ and $S_1'$, the latter inverted and summed with the first, comprise the NMR signal of a single view "A" under this sequence. Note that the y gradient field $G_y$ changes between view "A" and subsequent view "B". This pulse sequence is described in detail in U.S. Pat. No. 4,443,760, entitled: "Use of Phase Alternated RF Pulses to Eliminate Effects of Spurious Free Induction Decay Caused by Imperfect 180 Degree RF Pulses in NMR Imaging", and issued Apr. 17, 1984 and assigned to the same assignee as the present invention.

It will be apparent from the above example that the energy required to develop the gradient fields ("gradient") for a particular scan will vary significantly between gradient axes. In general, the power demanded by the gradients is unequal, with the dominant axis with regard to power consumption varying depending on the orientation of the slice sequence and the particular imaging technique used. It is not unusual for one gradient to require two to three times more power than the other gradients and in certain imaging techniques one gradient may require over five times as much power as the other gradients. The power required to generate a gradient field depends both on the peak amplitude of the gradient field, which is proportional to the current in the gradient coil, and on the rate of rise of magnetic field required by that gradient, which is proportional to the voltage applied across the coil.

Each gradient amplifier block is sized to handle the peak load it will experience during the widest feasible range of imaging techniques. This preserves a flexibility in the types of imaging sequences that may be performed on the MRI equipment. However, as a result of the variation in power use among the gradients, it is inevitable that in most scanning sequences one or more gradient amplifiers will be running at substantially less than full capacity.

Each gradient amplifier may contain eighty power transistors as required to produce adequate power to drive the gradient coils. For reasons of economy, each power transistor is operated near the limits of its power ratings. The resultant "semiconductor wear", caused by repeated thermal stress, significantly affects the life of the amplifier. When the amplifiers are connected in series to produce a gradient voltage, they carry equal current and hence experience equal semiconductor wear. Unnecessary amplifiers therefore only increase the total semiconductor wear.

SUMMARY OF THE INVENTION

This invention relates to a gradient amplifier system in which individual amplifiers are switched among the gradient axes to improve the efficiency and reliability of the MRI apparatus.

The invention includes a gradient waveform preprocessor for generating a master signal for each gradient axis. This master signal is connected to one or more amplifiers by means of an input switch matrix to form one or more amplifier stacks. The amplifiers in the stack operate together in response to the gradient master signal. Each amplifier stack drives a gradient coil to produce the desired gradient field.

It is one object of the invention to permit gradient amplifiers to be flexibly assigned among the gradient axes and thus to use the amplifiers power more efficiently. Extra amplifiers may be switched to the gradient axes requiring extra power, and away from those gradients requiring less power, under a given pulse sequence. Therefore, gradients of higher peak power may be produced in an MRI system with less, total amplifier power.

It is another object of the invention to permit the rotation of amplifiers among axes to eliminate uneven "semiconductor wear" caused by consistently using one amplifier or stack of amplifiers with the gradient having the highest power demand. By rotating the amplifiers, semiconductor wear may be distributed among all amplifiers thereby increasing the mean time between failure of the amplifier system.

In the preferred example described herein, each amplifier may be assigned to a stack associated with a particular gradient axis or place in an offline stack. Unused amplifiers may be "parked" in the offline stack. In the offline position, the amplifier is electrically isolated from the other stacks and other amplifiers.

Thus it is another object of the invention to allow amplifiers to be parked off line to be added to a stack in the event that additional power is required or for use as a back-up amplifier to be switched "on line" in the event that another amplifier fails.

It is a further object of the invention to provide a means of electrically isolating a failed amplifier so that it doesn't interfere with the other amplifiers in the gradient stacks.

Other objects and advantages besides those discussed above shall be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

DETAILED DESCRIPTION OF THE PREFERRED EMBODIMENT

Figure 2:
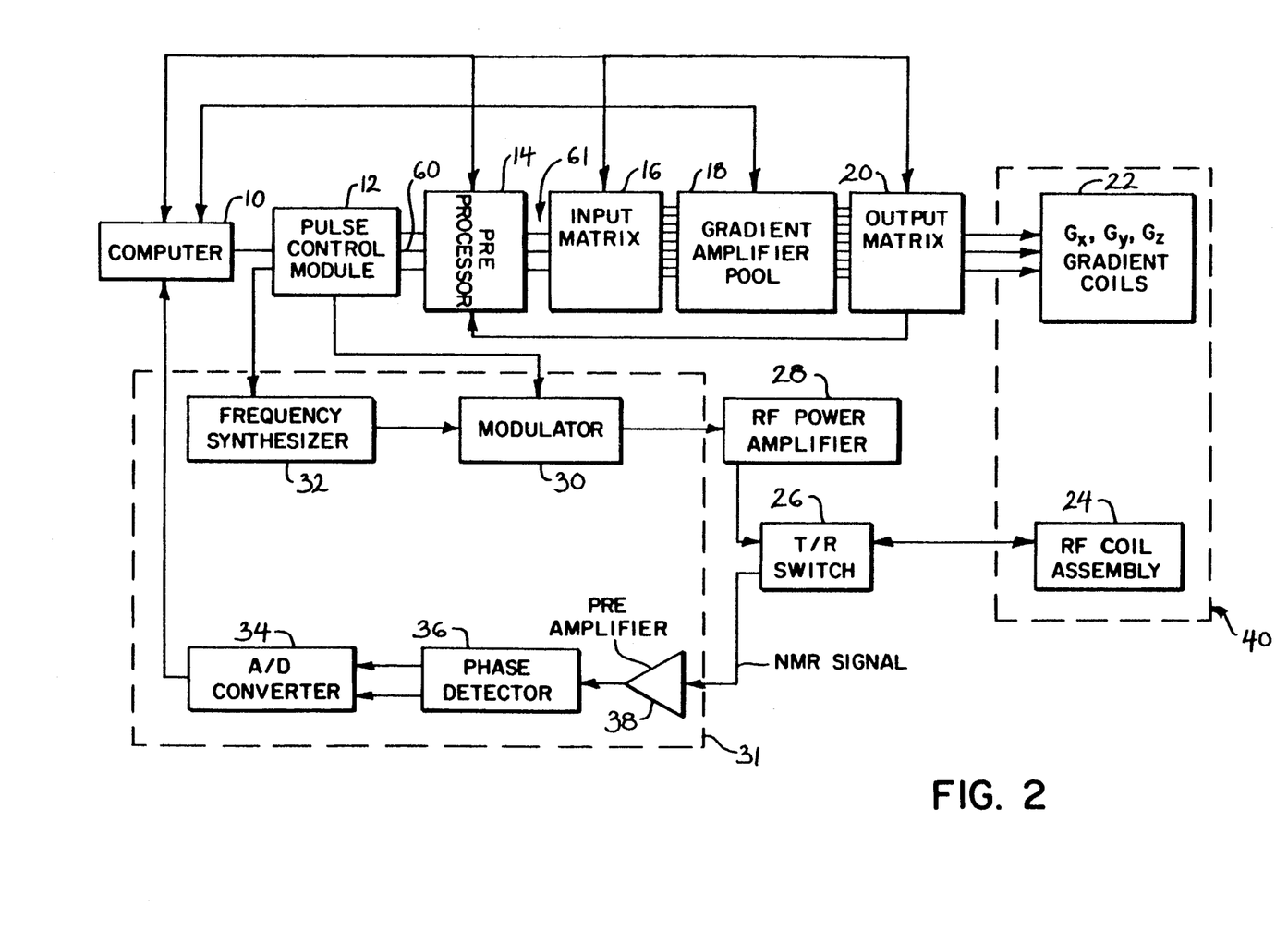
FIG. 2 is a block diagram of an MRI apparatus incorporating the present invention.

Referring to FIG. 2, an MRI system includes a pulse control module 12 which synthesizes properly timed pulse sequences, such as that shown previously in FIG. 1 for spin warp imaging, under the control of a computer 10. The pulse control module 12 communicates by means of a digital signal 60 to a gradient waveform preprocessor 14 which converts the digital signal into three analog gradient signals 61, one for each gradient axis. The analog gradient signals 61 are communicated to an input matrix 16 which connects the signals to selected amplifiers 42 (not shown in FIG. 2) within the gradient amplifier pool 18, in a manner to be described in more detail below.

The output signals from the amplifiers 42 of the gradient amplifier pool 18 are combined, according to the gradient axis of the signal being amplified, by output matrix 20. The thus combined signals from output matrix 20, one for each gradient axis, produce the gradients $G_x$, $G_y$, and $G_z$ as described above, by means of gradient coil assembly 22.

The pulse control module 12 also controls a radio frequency synthesizer 32 which is part of an RF transceiver system portions of which are enclosed by dashed line block 31. The pulse control module 12 additionally controls an RF modulator 30 which modulates the output of the radio frequency synthesizer 32. The resultant RF signals, amplified by power amplifier 28 and applied to RF coil 24 through transmit/receive switch 26, are used to excite the nuclear spins of the imaged patient (not shown).

The MR signals from the excited nuclei are picked up by the RF coil 24 and presented to preamplifier 38 through transmit/receive switch 26, to be amplified and then processed by a quadrature phase detector 36. The detected signals are digitized by an high speed A/D converter 34 and applied to computer 10 for processing to produce images of the patient.

Figure 3:
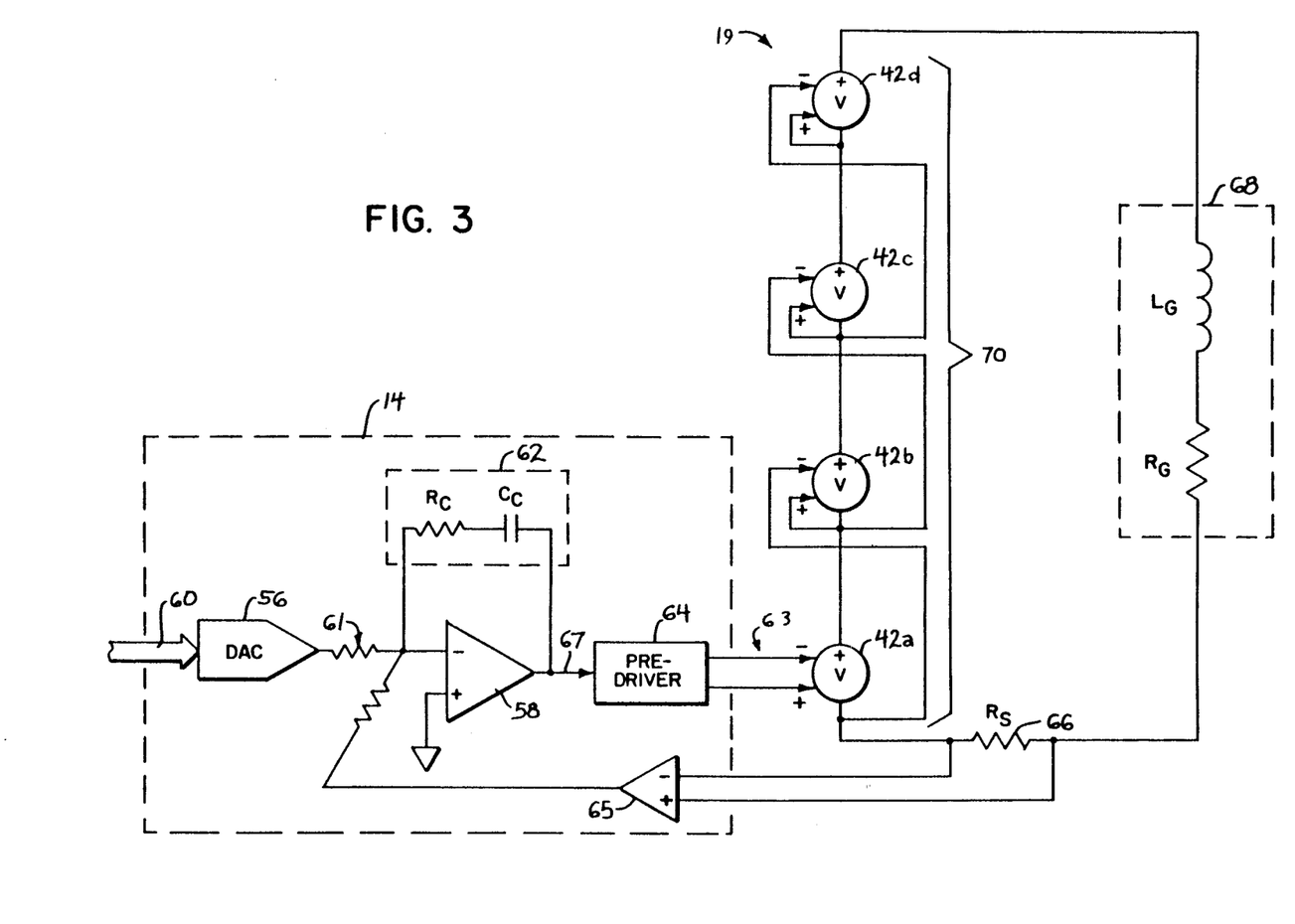
FIG. 3 is a simplified schematic diagram of an amplifier stack for one gradient axis showing the interconnections of amplifiers and their associated gradient signal preprocessor circuitry.

Referring to FIG. 3, the circuitry of the gradient signal preprocessor 14 for one gradient axis includes a digital to analog converter ("DAC") 56 which receives the digital signal 60 and provides an analog gradient signal 61 which is connected to the inverting input of error amplifier 58. Error amplifier 58 includes a compensation network 62, in its feedback path, to stabilize the overall gradient amplifier "stack" 19 as will be described below. The error signal 67 from the error amplifier 58 is received by predriver circuitry 64 which boosts the power and voltage of the error signal 67 and creates the master signal 63 having dual differential outputs as is necessary to drive the amplifiers 42a–d.

By means of the input and output matrix 16 and 20 (shown generally in FIG. 2), any number of amplifiers 42, up to the maximum number of amplifiers 42 in the gradient amplifier pool 18, may be connected together in a "stack" 19, each amplifier in the stack 19 working together with the others to amplify the master signal 63.

Referring still to FIG. 3, the interconnections of a single stack 19 of four amplifiers 42 for one gradient axis is shown. The master signal 63 from the predriver 64 is received by the input of a first amplifier 42(a) in the amplifier stack 19 within gradient amplifier pool 18. Each amplifier 42 operates as a unity gain, voltage-controlled voltage source, and the combination of the amplifiers 42 is accomplished by placing the amplifier outputs 42 in series so that their voltages add. Hence, the addition of each amplifier 42 increases the peak voltage that may be obtained by the amplifier stack 19. The actual voltage at the output of the amplifier stack 19 is dependent on the value of the master signal 63 and the feedback signal from feedback current sensing resistor $R_s$ to be described below.

Each amplifier 42 has a floating output, so that the outputs may add by series connection, and hence each amplifier has a positive and negative output terminal. The construction of such amplifiers is known in the art as exemplified by U.S. Pat. No. 3,808,545 entitled: "High Power Bridge Audio Amplifier" and incorporated herein by reference. The positive output terminal of the first amplifier 42(a) in the stack 19 is connected to the negative output terminal of the second amplifier 42(b) in the stack 19 and positive terminal of the second amplifier 42(b) in the stack 19 is connected to the negative terminal of the third amplifier 42(c) in the stack 19 and so on until each of the four amplifiers 42 is thus series connected.

If the input common mode rejection ratio ("CMRR") of the amplifiers 42 were unlimited, each amplifier 42 could be fed directly by the same master signal 63 from the predriver 64, rather than only the first amplifier in the stack 42(a). The limited CMRR of the amplifiers 42, however, requires that the input signal to each amplifier 42 in the stack 19 be boosted to an average voltage near the output voltage of that amplifier 42. This is accomplished by using the output of the first amplifier 42(a) in the stack 19 to provide the input to the second amplifier 42(b) in the stack 19 and using the output of the second amplifier 42(b) in the stack 19 to provide the input of the third amplifier 42(c) in the stack 19 and so forth. For example, for the first and second amplifiers 42(a) and (b), the negative output terminal of the first amplifier 42(a) is connected to the negative input terminal of the second amplifier 42(b) and the positive output terminal of the first amplifier 42(a) in the stack 19 is connected to the positive input terminal of the second amplifier 42(b) in the stack 19. This arrangement is continued for each of the three amplifiers 42 above 42a in the stack 19.

The positive output of the fourth amplifier 42(d) in the stack 19 is connected to one terminal of a gradient coil 68 for the gradient axis associated with the master signal 63. The gradient coil 68 consists of a number of turns of a copper conductor and is arranged in proximity to the patient as is generally described in U.S. Pat. No. 4,737,716 entitled: "Self-Shielded Gradient Coils For Nuclear Magnetic Resonance Imaging" issued Aug. 12, 1988 and assigned to the same assignee as the present invention. The gradient coil 68 may be modeled for the purposes of the present invention as a series connected inductor, $L_G$, and resistance $R_G$.

The remaining terminal of the gradient coil 68 is connected through a feedback current sensing resistor $R_s$ to the negative terminal of the first amplifier 42(a) in the stack 19.

The voltage across feedback current sensing resistance $R_s$ is received by instrumentation amplifier 65 and fed back to the negative input of the error amplifier 58 to provide feedback control of the current through the gradient coil 68. The compensation network 62 around the error amplifier 58 is selected to provide stability to the amplifier stack 19 according to feedback stability criteria as are generally understood in the art. $R_C$ is selected to be proportional to the effective inductance $L_E$ of the gradient coil 68 as seen by an individual amplifier 42, and $C_C$ is selected to be proportional to the inverse of the effective resistance $R_E$ of the gradient coil 68 seen by an individual amplifier 42. The effective inductance $L_E$ and resistance $R_E$ differ from the actual inductance $L_G$ and resistance $R_G$, depending on how many amplifiers 42 are connected together in the stack 19, as given in the following equations:

$$L_E = \frac{L_G}{N} \quad (1)$$

$$R_E = \frac{R_G}{N} \quad (2)$$

where N is the number of amplifiers 42 in the stack 19.

This variation of the effective impedances seen by an individual amplifier 42 may be understood by considering that for a given change in voltage across one amplifier 42, the gradient coil 68 will experience four times the increase in voltage (for a four amplifier stack) and thus four times the expected current will flow through the current feedback resistor $R_S$. For this reason, the impedance of the gradient coil 68 will appear to vary depending on the number of amplifiers 42 connected together in the stack 19.

This variation of effective impedance, or amplifier gain, requires that the compensation network 62 be adjusted depending on the number of amplifiers 42 connected together in the stack 19. A signal from a switch controller (not shown) simultaneously controls the value of the compensation network 62 in the feedback path of the error amplifier 58 at the same time it controls the switch positions of the input and output matrix 16 and 20 which determine the number of amplifiers 42 in the stack 19 for each particular gradient. The compensation network 62 is adjusted by a digital signal to a programmable resistor array (not shown) which generates the value $R_C$. Thus, in practice, $C_C$ is held constant and $R_c$ is reduced by the number of amplifiers in the stack. $R_c$ is the primary factor controlling amplifier stability at high frequency.

The gradient signal preprocessor circuitry shown in FIG. 3 is repeated for each gradient axis or amplifier stack 19.

Figure 4:
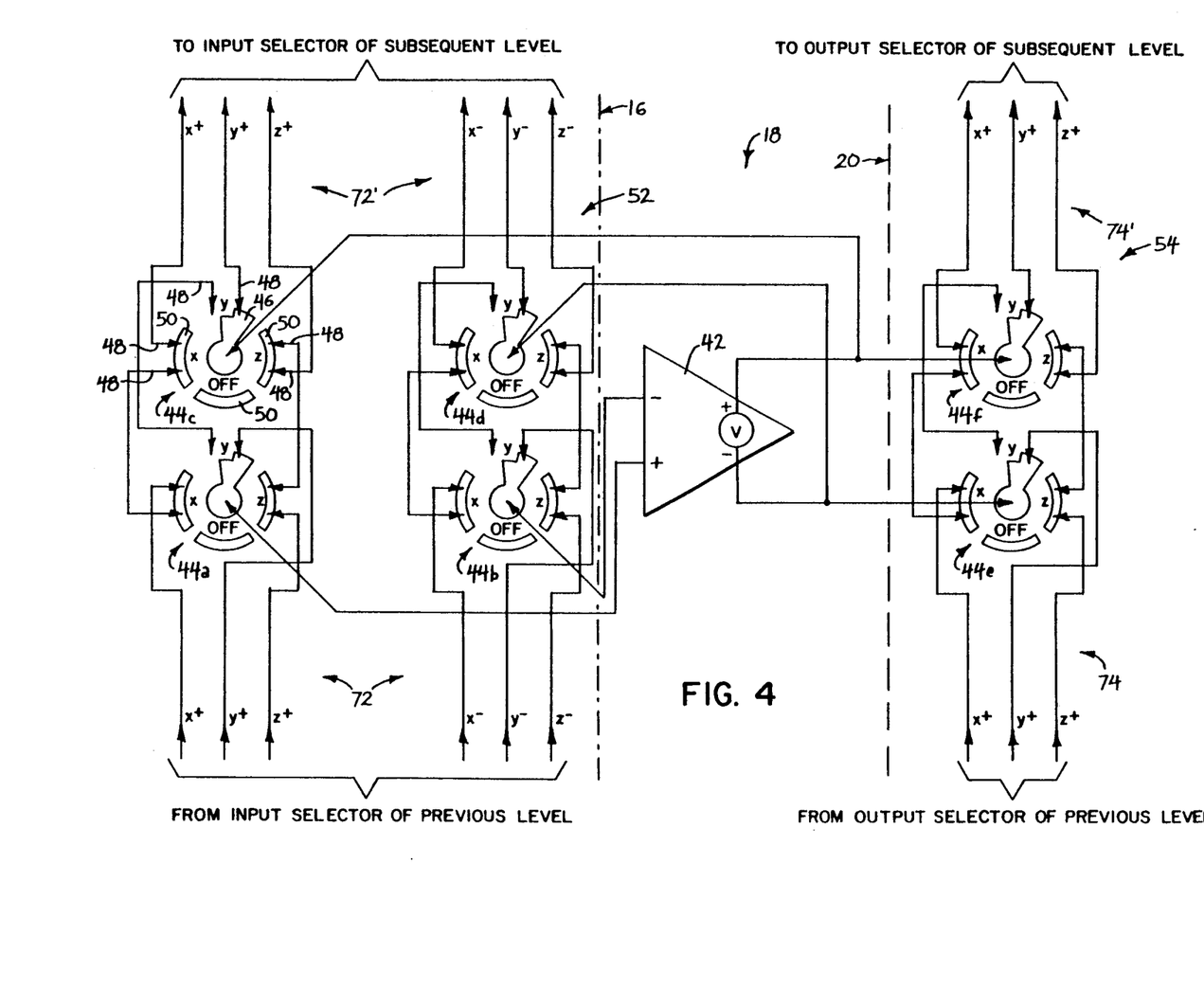
FIG. 4 is a schematic diagram of the input and output selectors, which make up the input and output switch matrices of FIG. 2, associated with one gradient amplifier of the gradient amplifier system shown in FIG. 2.

The means for connecting together the amplifiers 42 from the amplifier pool 18 into stacks for each gradient, will now be described. Referring to FIG. 4, each amplifier 42 within the amplifier pool 18 is assigned to a different level; one such level being shown in FIG. 4. An input and output selector 52 and 54, within the input matrix 16 and output matrix 20, is also assigned to each level and thus to each amplifier 42. The input and output selectors 52 and 54 are comprised of a set of interconnected four-position switches 44. Each input selector 52 has four such four-position switches 44(a)-(d) placed on an input bus 72 running between levels. The output selector 20 is comprised of two such four-position switches 44(e) and (f) placed on an output bus 74 also running between levels.

Each four-position switch 44 has a single pole 46 that may be moved to one of four-position: three associated with each of the three gradients $G_x$, $G_y$, and $G_z$, and an "off-line" position. A throw pair 48 is associated with each of the three gradient positions however the pole 46 contacts only one of the throws 48 in each pair when it is at that position. The throw in each pair 48 that contact the pole 46 will be termed the "contacting throw".

Three shorting links 50 move together with the pole 46 to short together the throw pairs 48 at the positions not occupied by the pole 46. Each of the four poles 46 of the four, four-position switches 44(a)-(d) of the input selector 52 as well as the two poles of the two, four-position switches 44(e)-(f) of the output selector 54 move together so as to be always pointing to the same position.

The input selector 52 receives six signals from the previous level via bus 72, two for each gradient $G_x$, $G_y$, and $G_z$ comprising the positive and negative differential signals necessary for driving the inputs to the amplifier 42. For the first level, these six inputs will be the gradient signal 63 from the preprocessor 14. For subsequent levels the input signals may be either gradient signal 63 or the output from a previous amplifier 42 depending on the stack 19 configuration as will be apparent from the following description.

Each of the positive signals from the previous level is connected to the corresponding one of the three contacting throws of each throw pair 48 on a first four-position switch 44(a). The negative signals are likewise connected to the corresponding contacting throws of each throw pair of a second four-position switch 44(b). The poles of these two switches are connected to the positive and negative inputs to the amplifier 42 respectively. The remaining non-contacting throw in each throw pair is connected to the corresponding non-contacting throw of a third and fourth four-position switch 44(c) and 44(d) respectively. The contacting throws of these third and fourth four-positions switches 44(c) and 44(d) are in turn connected to the input bus 72' leading to the next level and the input selector for the next level (not shown).

The poles of the third and fourth switches 44(c) and 44(d) are connected to the positive and negative outputs of the amplifier 44 respectively. During operation of the amplifier stack 70, the appropriate gradient signal will be input to the amplifier 42 and the output of the amplifier 42 will be transmitted to the input of the next level input selector (not shown). The gradient signals not selected, will bypass the present level through the shorting links 50 of four-position switches 44(a)-(d).

For example, if the poles of these the input selector switches 44(a)-(d) are at the "y" gradient position, the negative "y" gradient signal and the positive "y" gradient signal from the input bus 72 and the previous level will be connected to the positive and negative inputs of the amplifier 42 through the first and second input selector switches 44(a) and 44(b). The shorting links 50 of the first and second switches 44(a) and 44(b) will connect the throw pairs at the "x" and "z" positions together shunting the x and z signals to the third and fourth switches 44(c) and 44(d) respectively. The shorting links 50 of the third and fourth switches 44(c) and 44(d) will in turn connect the "x" and "z" signals to the input bus 72' which proceed to the next level. The "y" signal, on the other hand, will have been broken by the first and second switch 44(a) and (b), through the action of their poles 46 which contact only one throw 48. At the third and fourth switch 44(c) and 44(d) a new "y" signal is connected to the input bus 72', leading to the next level, by the poles 46 of the third and fourth switch 44(c) and 44(d) which, as mentioned, are connected to the output of the amplifier 42.

In a similar manner, the output of the amplifier 42 is connected to the poles 46 of the two, four-position switches 44(e) and (f) that form the output selector 54 for that level. Outputs from the previous level, one for each gradient $G_x$, $G_y$, $G_z$ are connected to the contacting throws 48 of the first switch 44(e). Depending on the switch position, the outputs from the previous level are either shunted to the non-contacting throw of the second switch 44(f) or connected to the negative output of the amplifier 42. The second switch 44(f), in turn, connects each of the signals shunted from the first switch 44(e) to the output bus 74' leading to the next level. The remaining signal, corresponding to the gradient axis to which the selectors 54 and 52 are positioned, is taken from the positive output of the amplifier 42 and connected to the output bus 74' leading to the next level by the pole 46 of the second switch 44(f). Accordingly, the outputs of the amplifiers 42 at different levels may be placed in series.

The poles of the four-position switches 44 are driven by an AC gear motor. The contacts on the switches 44 of the output selector 54 are silver graphite riding on silver surfaces and the contacts of the switches 44 on the input selector 52 are gold plated. All contacts are bifurcated. The rotation of the four-position switches 44 is interlocked with the amplifiers 42 to prevent switch rotation when current is flowing through the input or output contacts.

This output and input selector arrangement is repeated for each level thereby allowing the amplifiers 42 in the amplifier pool 18 to be connected in stacks 70 associated with each gradient axis or to be taken off line. The proper input signals will be connected to the amplifiers 42 and the outputs of the amplifiers 42 will be connected in series in a manner similar to that shown in the four amplifier stack of FIG. 3.

Referring to FIG. 5, example amplifier configurations achievable under this gradient amplifier system are shown. In FIG. 5(a), nine amplifiers are evenly distributed over the three gradient axes. Amplifiers 1, 2, and 5 are assigned to gradient Gx, amplifiers 3, 4, and 6 are assigned to gradient $G_y$ and amplifiers 7-9 are assigned to axis $G_z$.

Figure 5A:
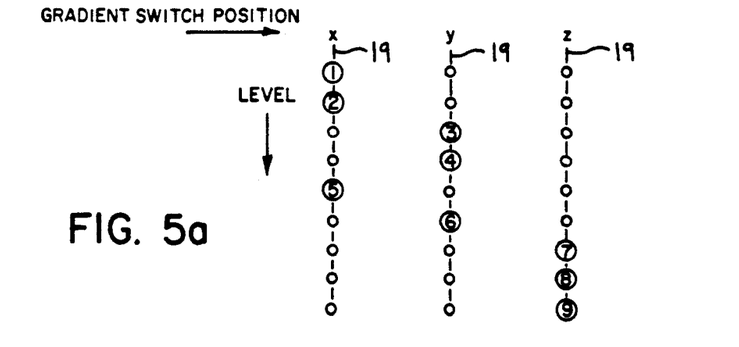
FIGS. 5(a), 5(i), 5(c) and 5(d) are pictorial representation of stacks of gradient amplifiers of the amplifier pool of FIG. 2 as configured by the present invention.
Figure 5B:
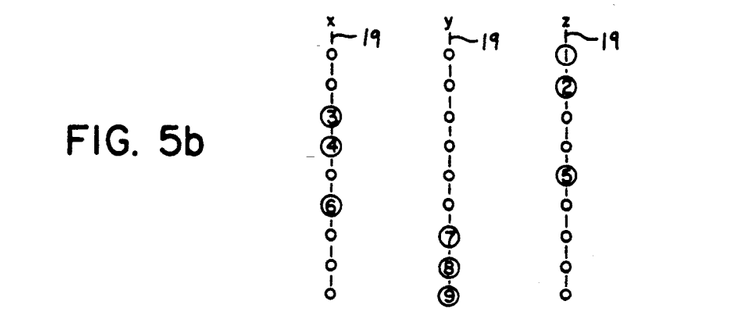

FIG. 5(b) shows a possible rotation of the amplifiers where amplifiers 1, 2, and 5 are assigned to gradient $G_z$, amplifiers 3, 4, and 6 are assigned to gradient $G_x$ and amplifiers 7-9 are assigned to axis $G_y$.

Note that the amplifiers need not be sequential. Amplifiers 1 and 2 are separated by a gap from amplifier 5, in FIGS. 5(a) and (b) and yet they work together electrically as a group.

Figure 5C:
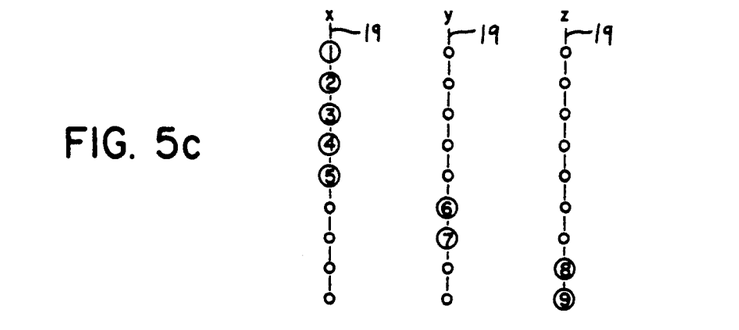

Referring to FIG. 5(c) the amplifiers are distributed unevenly over the axes. Amplifiers 1-5 are assigned to $G_x$ while amplifiers 6 and 7 are assigned to $G_y$ and amplifiers 8 and 9 are assigned to $G_z$. This configuration is useful to provide additional power to the x gradient. The y and z gradient axes will have reduced power capacity in this example.

Figure 5D:
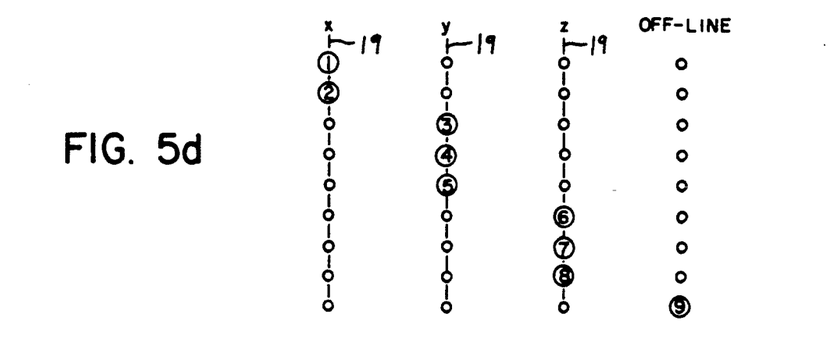

As mentioned, each amplifier may be put off line and assigned to none of the axes. In FIG. 5(d) amplifier 9 has been put off line to act as a spare should an additional amplifier be required. In the nine amplifier system of the preferred embodiment, one axis will then have a reduced amplifier number, typically an axis with reduced gradient field demand. The offline amplifier 9 is inactive and hence experiences negligible semiconductor wear.

Selection of the amplifier configuration is performed by the operator by means of commands processed through computer 10.

The above description has been that of a preferred embodiment of the present invention. It will occur to those who practice the art that many modifications may be made without departing from the spirit and scope of the invention. For example additional or fewer amplifiers may comprise the amplifier pool and connected as described by the addition or subtraction of input and output selectors as appropriate. Solid state switches may replace the mechanical rotary switches described herein permitting amplifier reconfiguration during the imaging sequence. Further, the amplifiers may be of varying power capacity. In order to apprise the public of the various embodiments that may fall within the scope of the invention, the following claims are made.

I claim:

1. In an MRI apparatus including gradient coils for applying a sequence of gradient fields to an imaged object during a NMR imaging sequence, each gradient field associated with a corresponding gradient axis, a gradient amplifier system comprising:
   a gradient waveform preprocessor for generating a gradient master signal for a gradient axis;
   a plurality of amplifiers having inputs and outputs;
   an input switch matrix for generating at least one input signal from the master signal and selectively connecting the input signal to the input of at least one amplifier to form an amplifier stack in which the amplifiers in the stack operate together in response to the gradient master signal; and
   an output switch matrix for combining the outputs of the amplifiers in the stack to produce a gradient output signal for driving the gradient coil associated with the gradient axis of the master signal;
   whereby the amplifiers may be selectively added or removed from the stacks by means of the input and output switch matrices.

2. The gradient amplifier system of claim 1 wherein each amplifier has a floating output and the output switch matrix combines the amplifiers outputs in series.

3. In an MRI apparatus including gradient coils for applying a sequence of gradient fields to an imaged object during a NMR imaging sequence, each gradient field associated with a corresponding gradient axis, a gradient amplifier system comprising:
   a gradient waveform preprocessor for generating a gradient master signal for each gradient axis;
   a plurality of amplifiers having inputs and outputs;

an input switch matrix for collecting the amplifiers into stacks with related inputs where the input of at least one stack is connected with each gradient master signal and at least one stack is offline and its input not connected to any signal; and an output switch matrix for combining the outputs of each of the amplifiers of a given stack that are not offline so as to produce an amplified gradient master signal;

whereby the amplifiers may be selectively assigned to one gradient axis or be put offline.

4. The gradient amplifier system of claim 3 wherein each amplifier that is offline is isolated from the other stacks.

5. The gradient amplifier system of claim 3 wherein each amplifier has a floating output and the output switch matrix combines the amplifiers outputs in series.

* * * * *